United States Patent [19]

Penney

[11] Patent Number: 4,535,319
[45] Date of Patent: Aug. 13, 1985

[54] METHOD AND CIRCUIT FOR MEASURING NONLINEARITY IN DUAL-FLASH ANALOG-TO-DIGITAL CONVERTER

[75] Inventor: Bruce J. Penney, Portland, Oreg.

[73] Assignee: Tektronix, Inc., Beaverton, Oreg.

[21] Appl. No.: 483,323

[22] Filed: Apr. 8, 1983

[51] Int. Cl.³ .................. H03K 13/02; H03K 13/75
[52] U.S. Cl. ......................................... 340/347 AD
[58] Field of Search .................. 340/347 AD; 371/57

[56] References Cited

U.S. PATENT DOCUMENTS

| | | | |
|---|---|---|---|
| 3,597,761 | 8/1971 | Fraschilla | 340/347 AD |
| 3,697,978 | 10/1972 | Prill | 340/347 AD |
| 3,967,269 | 6/1976 | Fletcher | 340/347 AD |
| 4,099,173 | 7/1978 | Zeskind | 340/347 AD |
| 4,386,339 | 5/1983 | Henry | 340/347 AD |
| 4,393,368 | 7/1983 | Rasmussen | 340/347 AD |
| 4,449,118 | 5/1984 | Dingwall et al. | 340/347 AD |
| 4,481,629 | 11/1984 | Hatata et al. | 371/57 |

Primary Examiner—B. Dobeck
Attorney, Agent, or Firm—John Smith-Hill

[57] ABSTRACT

A dual-flash analog-to-digital converter comprises a first quantizer (20) for quantizing an analog input in accordance with coarse amplitude levels and outputting a more significant bits signal (24) and a remainder analog signal (32); a second quantizer (34) for quantizing the remainder signal in accordance with fine amplitude levels to output a less significant bits signal (36); and digital corrective logic (38) which receives both digital signals and corrects carry errors in the quantization. An analog method of diagnosing errors in the operation of such circuit calls for applying the remainder signal (32) to a pair of comparators (45,46) having thresholds set at upper and lower ends of the normal quantization range of second quantizer (34). The output of the comparators is passed through an OR gate (48), a low pass filter (52,54) and another comparator (56) to provide an output indicator signal (58) when the remainder signal chronically falls outside of a predetermined range set by the threshold of comparator (56). Such method can be carried out digitally by modifying the digital corrective logic (38) to provide an additional output bit to indicate whether the second quantization is within or outside a normal quantization range. The output of the first quantizer (20) is monitored by the digital corrective logic (38) to provide a second additional bit indicating high analog input levels and to digitally apply video clipping to the output of the corrective logic.

19 Claims, 3 Drawing Figures

METHOD AND CIRCUIT FOR MEASURING NONLINEARITY IN DUAL-FLASH ANALOG-TO-DIGITAL CONVERTER

FIELD OF THE INVENTION

This invention relates to high-speed analog-to-digital converters, more particularly to dual-flash analog-to-digital converters with digital error correction for video applications. In the literature, dual-flash analog-to-digital converters are also referred to as subranging A/D converters or parallel-series-parallel converters. However, the present invention is not limited to such species of converters.

BACKGROUND OF THE INVENTION

U.S. Pat. No. 3,967,269 to Fletcher describes the general arrangement and operation of dual-flash digital-to-analog converters and discusses the various sources of errors or transfer function nonlinearities which can occur in their operation. Fletcher further discloses a digital corrective feedback circuit for detecting, in the second quantization stage, errors which occurred in the first quantization stage, and generating a digital correction signal to correct the binary output of the converter to compensate for such errors. A further analysis of such errors and methods of correcting them, using digital corrective logic, appears in W. K. Kester, "PCM Signal Codecs for Video Applications", SMPTE Journal, November, 1979, Vol. 88, pp. 770-78. In that article, Kester further describes various systems and methods of testing the performance of video A/D converters for linearity, accuracy and other performance characteristics. A. S. Muto et al., "Designing a 10 Bit, 20 Mega Sample per Second Analog to Digital Converter System", Hewlett Packard Journal, November, 1982, pp. 9-20, discloses an advanced design of a dual-flash analog-to-digital converter wherein the digital error correction is implemented by using, in the second quantizer, an extra bit which is redundant of the least significant bit from the first quantizer, and discloses an algorithm for mathematically extracting the final output code from the overlapping codes of each quantization step.

The structure and operation of the foregoing converters tends to mask internal quantization problems which arise in the operation of dual-flash analog-to-digital converters. Diagnostic information on the analog-to-digital conversion performance, such as indication of errors due to first quantizer gain or offset errors, digital to analog gain or offset errors, clock or delay timing errors, or limiter amplifier offset errors, is unavailable to aid in calibration of the converter. Aside from providing a corrected binary output signal, the aforementioned Fletcher patent only provides an instantaneous overflow-underflow signal, which is used to correct the binary output of the first parallel stage. However, monitoring this signal does not provide sufficient diagnostic information properly to calibrate the converter. In the more modern designs, disclosed in the aforementioned Kester and Muto et al. articles, even the overflow-underflow feedback signal of Fletcher is unavailable. Moreover, since these designs are conventionally executed in integrated circuits, it is impractical to probe the internal workings of the circuits to obtain the desired diagnostic information. None of the test systems and methods described by Kester meet this need.

The prior art also does not disclose any means for determining a persistent near over-range condition in the first quantizer. Finally, none of the aforementioned converter designs provide for clipping, digitally or otherwise, to deliberately introduce nonlinearities into the transfer functions of the converters. This capability would be particularly useful for digitizing video signals.

SUMMARY OF THE INVENTION

One object of the invention is to provide diagnostic information on the internal performance of a dual-flash analog-to-digital converter.

A second object is to provide such diagnostic information in a converter incorporating digital error correction.

A further object of the invention as aforementioned is to provide such diagnostic information in circuits wherein the digital error corrector does not provide a feedback correction signal.

Another object of the invention is to provide diagnostic information pertaining to chronic over or under-range conditions in the second quantizer of a dual-flash analog-to-digital converter.

Yet another object is to provide diagnostic information of repeated near over-range conditions in the first quantizer of such converters.

An additional object is to provide a digital clipping capability in dual-flash analog-to-digital converters.

The invention provides for a method of diagnosing nonlinearities in the internal operation of a dual-flash analog-to-digital converter comprising a first quantizer means for quantizing an analog signal in accordance with a plurality of coarse amplitude or quantizing levels to provide a first digital output signal and an analog remainder signal; and second quantizer means for quantizing the analog remainder signal in accordance with a plurality of fine quantization levels to provide a second digital output signal. The first digital output signal typically comprises a plurality of more significant digits, whose numeric value of coarse amplitude levels, plus the analog remainder signal, equals the analog input signal. The second quantizer means can include over-range and under-range quantizers. It should be understood that reference to a dual-flash converter can apply to intermediate stages of a multi-flash converter. In the context of the aforementioned Fletcher patent, the first quantizer means encompasses a parallel analog-to-digital converter, a digital to analog converter for converting the first digital signal back to an analog signal, and a subtractor for subtracting the output signal from the digital to analog converter from the input analog signal to provide the analog remainder signal. The first quantizer means can likewise encompass a series encoder such as the hybrid-Grey code encoders disclosed in the aforementioned Kester article. In its broadest applications, the method disclosed herein can be applied to digital-to-analog converters without digital error correction, or with digital error correction, either of the feedback type, as disclosed in the aforementioned Fletcher patent, or of the non-feedback type, as disclosed in the Kester article at FIG. 6 and in the Muto et al. article at pp. 17-18.

In a preferred embodiment, the method of the invention comprises operating the analog-to-digital converter with a time-variant analog input signal, comparing the remainder signal to a pair of thresholds spaced apart about the normal range of the second quantizing means to obtain an over-range or under-range error signal and displaying the signal on a test instrument. To provide a single error signal, the outputs of both comparisons are logically ORed together. The signal is next time-averaged over a time-interval which is much longer than the interval between A/D conversions in the converter. The time-averaged signal is then compared with a threshold which is set to indicate a repeated or chronic over-range or under-range condition during the averaging time interval. Whenever the average signal exceeds such threshold, an indicator signal is applied to a display to visually indicate the existence of the repeated over-under range condition.

The foregoing method can further include monitoring one or more most-significant digits from the first quantizer for high levels, time-averaging the occurrence of such high levels, and comparing the time-averaged value of the monitored digit with a threshold which is set to indicate, for example, a chronic near overflow condition in the first quantizer. The output of the comparison is then displayed.

In an analog embodiment of the method, the comparison thresholds can be set at non-integer positions, that is, between the fine amplitude levels of the second quantizer means. The pair of thresholds can be multiple pairs of thresholds so that the output signal can indicate the magnitude as well as the presence of an over-range or under-range condition.

The foregoing method can be carried out in an analog-to-digital converter circuit comprising the aforementioned first and second quantizing means and digital error correction means, including over-range and under-range quantization means in the second quantizing means. The comparison step of the aforementioned method is performed digitally by providing, in the digital error corrector, a means responsive to the output of the second quantization means and operation of the error correction logic for providing a digital error output signal. Preferably the digital error corrector is a binary corrector operable to receive M bits from the first quantizer and N bits from the second quantizer to produce a corrected binary output signal comprising $M+N-1$ data bits. Such corrector is further operable to output a binary error bit which defines the aforementioned digital error signal. The digital error corrector can further include means for monitoring a most-significant bit from the first quantizer means to output a binary bit defining a first quantizer level signal. The error and level signals are each input to low pass filters for time-averaging and the outputs of such filters are applied to comparators. The comparators are biased with a predetermined reference voltage to provide a normally-zero output when the error and level signals, respectively, occur only occasionally, but switch on when such signals begin to occur frequently, within the time constant of the low pass filters. The outputs of these comparators are applied to visible indicator means. The digital corrector can also include means for inputting a clipping control signal and means responsive to such signal to provide clipping within the corrected digital output signal.

The foregoing and other objects, features and advantages of the invention will become more readily apparent from the following description of a preferred embodiment, which proceeds with reference to the accompanying drawings.

DESCRIPTION OF PREFERRED EMBODIMENT

Figure 1:
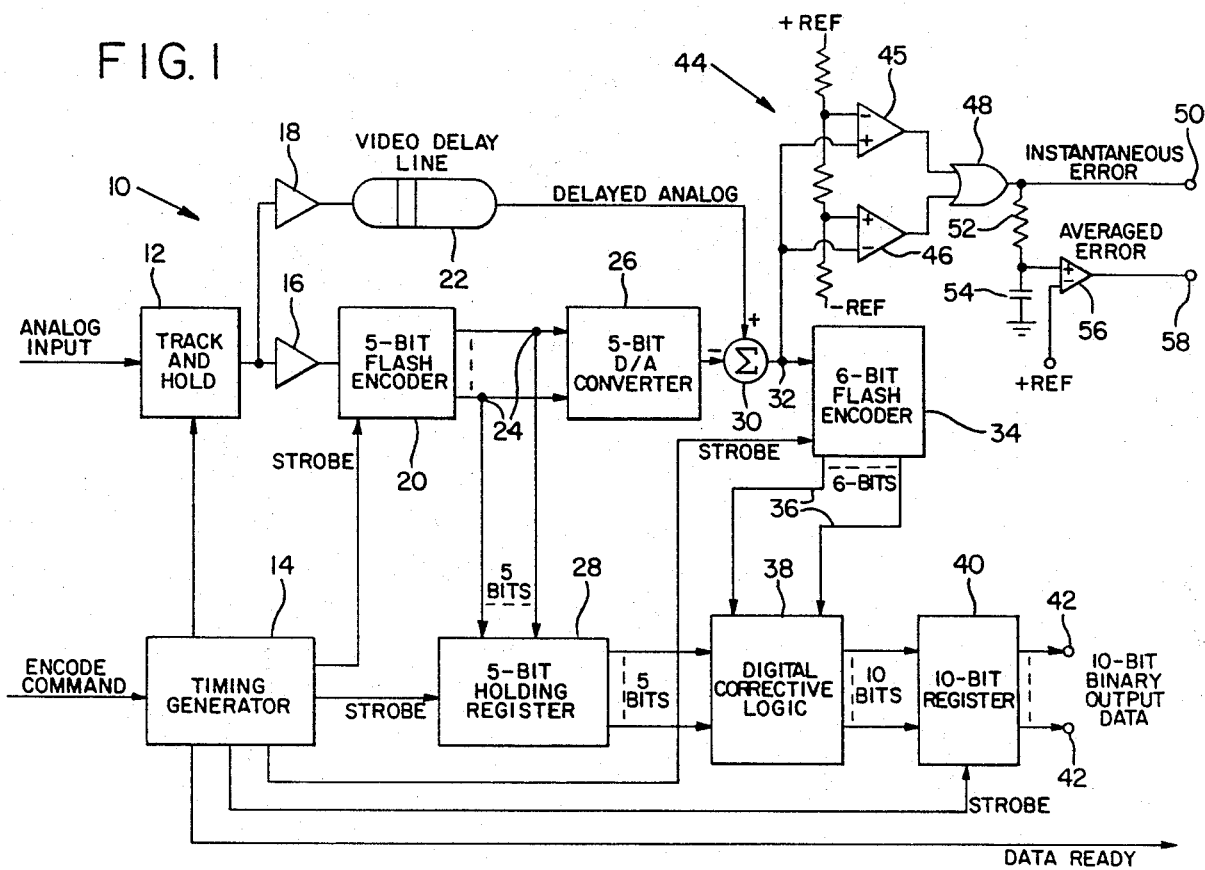
FIG. 1 is a block diagram of a dual-flash analog-to-digital converter with a digital corrective logic, modified to provide diagnostic information derived from an internal analog signal in accordance with the method of the present invention.

Referring FIG. 1, a dual-flash analog-to-digital converter 10 has an analog input which is periodically sampled by a track and hold circuit 12. Sampling by element 12, as well as operation of the remainder of circuit 10, is controlled by a timing generator circuit 14, which is responsive to an encode command to produce various timing signals, as is well known in the art. During each timing period, the output of the track and hold circuit is passed through suitable amplifiers 16,18 to a first quantizer comprising, in the present example, a 32-level parallel or flash encoder 20, and a video delay line 22. If encoder 20 and delay 22 are suitably designed, element 12 can be left out. The binary five-bit output of encoder 20 is transmitted on lines 24 to a digital-to-analog converter 26 and to holding register 28. Converter 26 provides to a summing device 30 an inverted analog output signal equivalent to the input digital signal. The output of video delay line 22, a delayed version of the analog input signal, is input to adder 30 to subtract the analog signal from converter 26 and thereby produce an analog remainder signal on line 32.

Such remainder signal is input to a 64-level parallel encoder 34. Encoder 34 provides a six-bit digital output on lines 36. This output, together with the output from holding register 28, is input to a digital corrective logic circuit 38. The six-bit output of encoder 34 includes a redundant bit which is used by circuit 38, as further described hereinafter, to digitally correct for conversion errors induced by nonlinearities in the first quantization step. The digital corrective logic circuit provides, through a suitable register 40, a binary output signal on lines 42 containing one less bit than the total number of bits provided by encoders 20 and 34, or ten bits in this example.

Referring back to the output of adder 30, analog remainder signal 32 is applied to a diagnostic circuit 44. In such circuit, signal 32 is input to two comparators 45,46. Comparator 45 is biased to compare the remainder signal 32 with predetermined threshold above the normal range of operation of converter 34, for example, at an analog level half way between quantization levels 47 and 48. Comparator 46 is similarly provided with a threshold below the range of converter 34, for example, at an analog level half way between levels 14 and 15. During normal operation of circuit 10, both comparators 45,46 will ordinarily remain off. When an over-range condition exists, comparator 45 will produce an output signal to OR gate 48. Similarly, when an under-range condition occurs, comparator 46 will provide an output signal to OR gate 48. In either case, the output signal is transmitted through the OR gate to an instantaneous error test point 50 for display on a suitable test instrument, such as an oscilloscope or counter. In case of a chronic nonlinearity in the first quantization step, error signals will repetitively appear at test point 50. Such signal is also time-averaged in a low pass filter comprised of resistor 52 and capacitor 54, connected to ground, having a time constant of sufficient duration to encompass a plurality of cycles of circuit 10. For a video converter sampling at 14.3 MHZ, a suitable averaging interval is on the order of $5 \times 10^5$ clock cycles or about 30 milliseconds. The time averaging circuit provides an averaged error signal to a comparator 56 for comparison to a predetermined threshold set to indicate the existence of a chronic over-range or under-range condition. When such a condition arises, comparator 56 provides an output signal on line 58.

Figure 2:
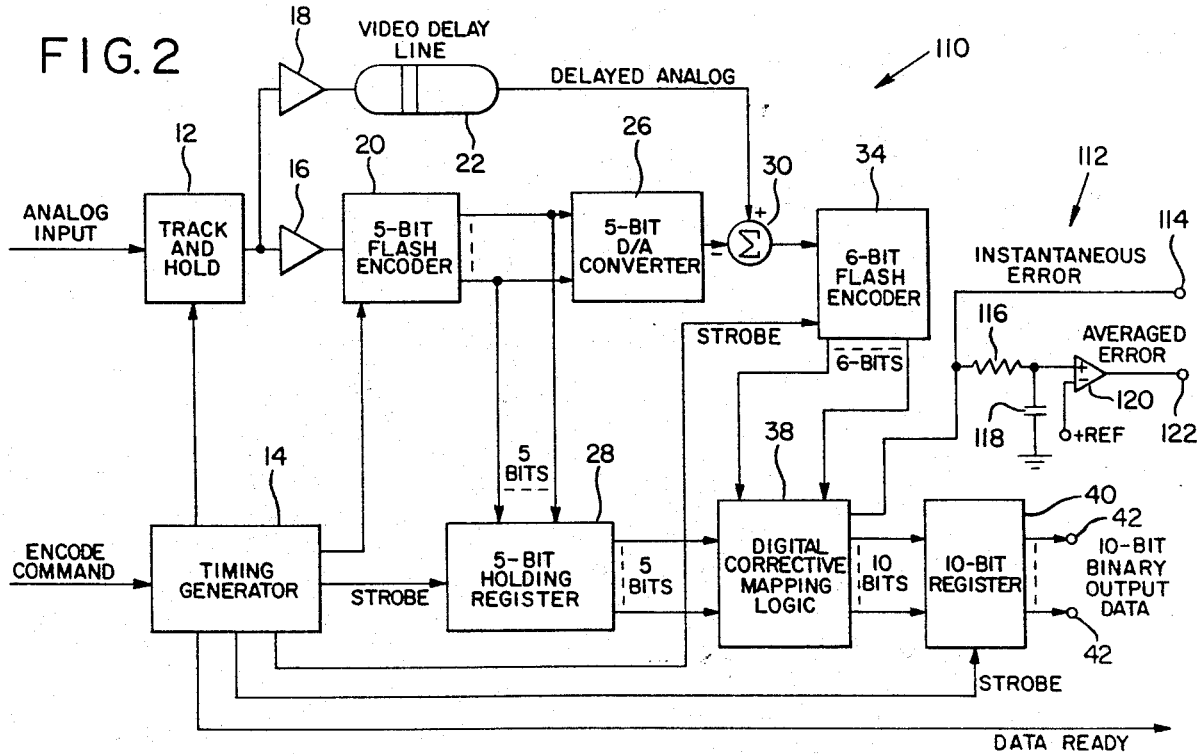
FIG. 2 is a block diagram similar to FIG. 1 in which the converter is modified to provide integer-based diagnostic information following the second quantizing step, in accordance with the invention.

Referring to FIG. 2, circuit 110 is largely identical to circuit 10, except that circuit 44 is omitted and generally similar circuit is connected to digital output 114 of digital corrective logic circuit 38. As mentioned above, circuit 38 uses the redundant bit from circuit 34 to provide a corrected binary output data signal on lines 42. In addition, such redundant bit is used to generate a digital output signal on line 114, which roughly corresponds to the signal provided at test point 50 in circuit 44, except that it can only provide over-range and under-range indications in integral steps. The comparison and ORing steps, provided by comparators 45,46 and OR gate 48 in circuit 44, are provided implicitly in the operation of circuit 38, as further described hereinafter. Thus, circuit 112 provides, in addition to an instantaneous error test point 114, a time-averaging low pass filter 116,118, and a comparator 120 for comparing the time averaged signal with a suitable reference to provide an output signal on line 22, corresponding to a predetermined repeated error rate.

Figure 3:
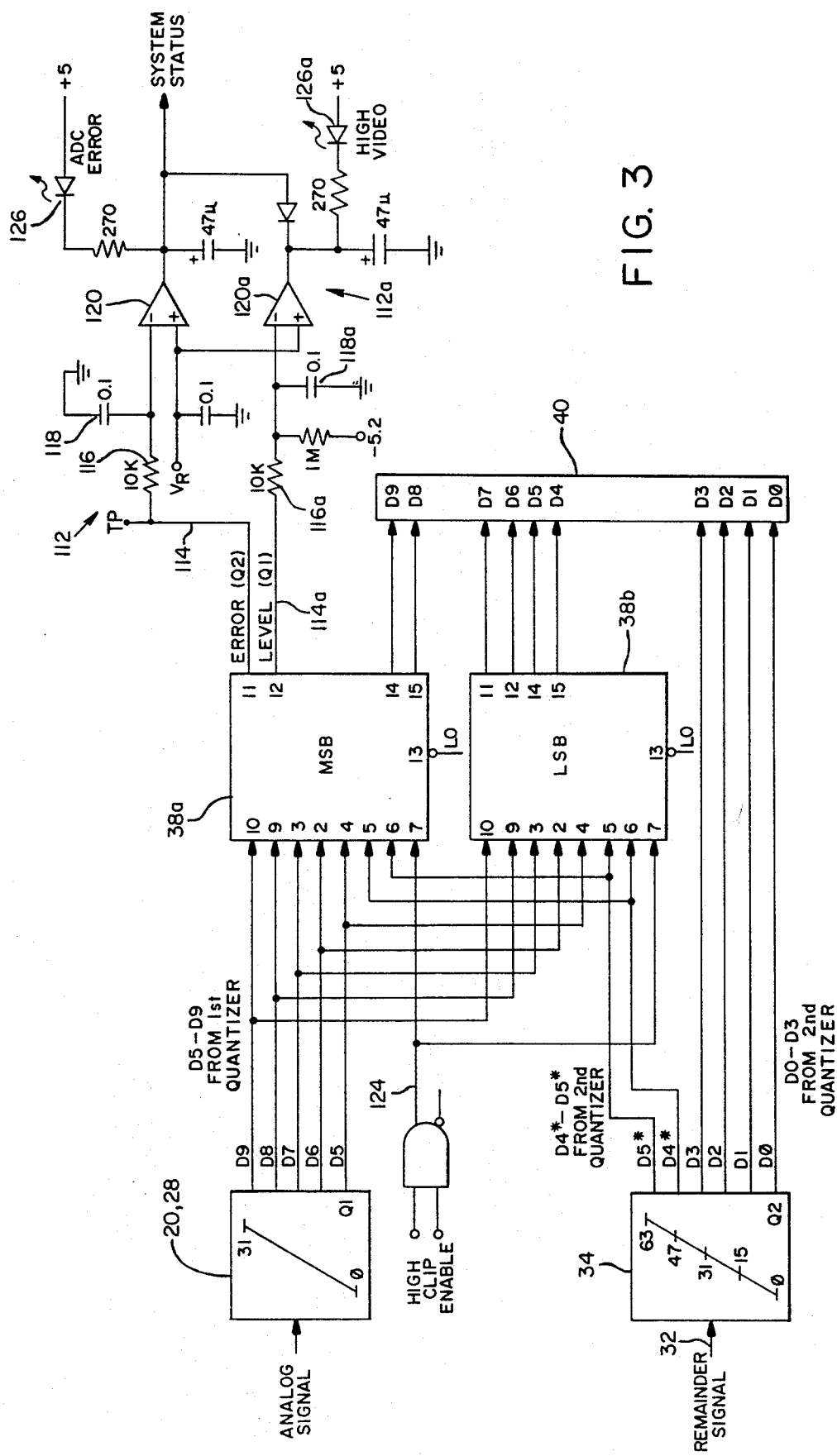
FIG. 3 is a schematic of a portion of FIG. 2 showing a preferred form of digital corrective logic and further details of circuitry for providing diagnostic information in accordance with the invention.

Referring to FIG. 3, the digital corrective logic element 38 and diagnostic circuit 112 are disclosed in greater detail. Referring to the block denoted by reference numeral 20,28 the first quantizer has five binary output signal lines, labeled D5 through D9 proceeding from least to most significant bit position. This encoder quantizes in accordance with 32 coarse quantization or amplitude levels, illustrated in block 20 by a transfer function having a quantization range from zero to 31. Block 34 represents the second quantizer, which quantizes the analog remainder signal 32 to produce a binary six-bit output signal on lines D0 through D5*. The D4* and D5* lines collectively transmit the aforementioned redundant data and the most significant of the less significant bits. Quantizer 34 is a 64-level quantizer, as indicated by the transfer function in block 34, ranging from level 0 to level 63. The overall range of quantizer 34 spans two coarse quantization levels of quantizer 20. Ideally, only a fine quantization range of 32 levels is needed properly to quantize the remainder signal. This ideal range is positioned within quantizer 34 symmetrically about level 31. The lowest 16 quantization levels, from zero to 15, define an underflow range. The uppermost 16 quantization levels, from 48 to 63, define an overflow range.

Digital corrective logic element 38 is provided by a 256×8 addressable memory. Suitable components for this purpose are provided by two 256×4-bit Motorola Memory Model MCM10149 programmable read-only memory (PROM) elements 38a,38b. Other components and memory arrangments can be used equally as well.

In general, the binary outputs from the quantizers are used as mapping addresses in the PROM to map the input uncorrected binary data into corrected binary output data. Since the normal quantizing range in the second quantizer is symmetrically positioned in the second quantizer, the four least significant bits are unaltered by the mapping procedure. Accordingly, such bits can bypass, or be mapped through, the digital error corrector. This is shown in FIG. 3, wherein digital data lines D0 through D3 out of quantizer 34 extend directly to the output register 40, without passing through PROMs 38a,38b. All five of the binary outputs from the first quantizer and the two most significant outputs from the second quantizer are input as addresses to each of the PROMS, at the pin numbers indicated along the left sides of elements 38a,38b. Also input, at pin 7 of each of the PROMS, is a clip enable line 124, for actuating a video clipping function, further described hereinafter. In connection with the clip enable function, it should be noted that the PROMS provide twice as many addressable data locations as are needed merely to map seven bits, bits D4* through D9, into the corrected binary data table, represented by bits D4 through D9. The clip enable in effect provides an additional addressing bit which, when set, causes the input data bits to map to a second array corrected digital output data which incorporates video clipping.

The output pins of the PROMs, labeled on the right sides of blocks 38a,38b, provide corrected digital data outputs on lines D4 through D9. Such data is either clipped or nonclipped, depending on the status of the clip enable bit. Pins 11 and 12 of PROM 38 provide two binary diagnostic data signals to diagnostic circuit 112, which is shown in somewhat greater detail than in FIG. 2. The instantaneous error signal line 114, connected to pin 11 of PROM 38a, applies the error signal to filter 116,118. The filtered input is applied to comparator 120. The output of the comparator is in turn provided to an indicator driver circuit including a light emitting diode (LED) 126. Connected to pin 12, in parallel with the foregoing circuitry, is a similar circuit 112a. Further description of circuit 112a is unnecessary; like components are identified by like reference numerals with subscripts "a". Exemplary component values are shown alongside the components. These values suit this circuit to video digitization applications.

The operation of the foregoing circuit is next described, with reference to the PROM listing appended to the end of this description.

The appended PROM listing contains notes in its heading and ending which briefly explain its organization and contents. Each section of the listing is identically organized in a series of columns. For present purposes, the left-most column and the first character of the second column can be ignored. The heading of the second column identifies that column as pertaining to "output data". Beneath it is a column heading of four 4-bit words. Since the PROMS 38a,38b only output 8 bits, only the second and fourth four-bit words are used. The first and third four-bit words, each denoted by heading "XXXX", are unused in this example.

The second four-bit word "EH98" identifies the output of pins 11, 12, 14 and 15 of PROM 38a. Column "E" refers to the output signal on line 114. The column headed "H" refers to the output signal on line 114a. The columns headed "9" and "8" are the two most significant output data bits. The fourth four-bit word "7654"

refers to the output data from pins 11, 12, 14 and 15 of PROM 38*b*.

The column of asterisks indicates that the subsequent data are comments, not used in the actual operation of the PROMs. These comment codes generally explain the operation of the mapping procedure. The first column of comment codes, entitled "ADCERR" refers to the presence or absence of an analog-to-digital converter error. The presence of such an error is denoted by a binary 1 in the first, fourth, fifth and eight sections. These sections pertain to the overand under-ranges of the second quantizer. The second column entitled "HIGH VID" indicates when a high-level signal will be generated on pin 12 of PROM 38*a*. The next two columns, entitled "OD9-OD5" and "OD4", are the corrected output data bits. In the first four sections these columns are identical to the binary data appearing in the second and fourth words of the output data column. The next column "CLIP ON = 1" denotes the status of the clip enable function provided on input line 124 in FIG. 3. In the first four sections, this function is off. In the latter four sections it is on, in which case "OD9-OD5" and "OD4" differ from the output data columns, as explained subsequently.

The next three columns "ID9-ID5", "ID5'", and "ID4'", identify the binary data input to the left side of PROMs 38*a*,38*b*. The notation "ID5'" and "ID4'" corresponds to "D5*" and "D4*" in FIG. 3. The rightmost column indicates the operation to be performed to map the input data into corrected output data and the error and high level indicators. For each of the eight sections of the listing, this operation is explained by a brief heading. In general, the mappings are constructed to correct miscarries caused by nonlinearities in the first quantization step, detected as under-range or over-range quantizations during the second quantization step. Thus, the presence of an under-range indication, such as in the first and fifth sections of the printout, indicates that the five more significant bits, "ID9-ID5" are one increment too great and the most significant bit of the less significant five bits is one increment too small. Accordingly, in the first section, the more significant bits are decremented by 1, and the next most significant bit "OD4" is incremented by 1. The inverse of this operation is carried out, as shown in the fourth section, when the second quantization is in the over-range. When the second quantization is in the normal range, the five more significant bits are correct and the next most significant digit "OD4" is set to zero or 1, depending on whether the quantization is in the lower or upper half of the normal range.

If the quantization is in either the under-range or over-range, the "ADCERR" bit is set to 1, except in the case of all-zero and all-one inputs (see end note in listing), and is otherwise set to zero. The "HIGH VID" bit is normally set to zero for all input values of "ID9-ID5" less than binary 11101, and is otherwise set to 1 to indicate high video levels.

The latter four sections are identical to the first four sections insofar as the error correction procedure and error and high level indications are concerned. However, because the clipping function is set "on", the form of the output data in these sections is altered to digitally effect high and low level video clipping. The last end note of the listing relates the clipped digital levels to standard analog video clipping levels. Accordingly, referring to the top lines of the fifth section, all binary inputs which correct to a level, expressed in the "OD9-OD5" and "OD4" columns as less than binary 001000, are automatically set to binary 001000. Similarly, referring to the bottom lines of the same section, all binary data that would have corrected to 110101 or greater is mapped to binary 110100. It will be seen upon examining the remaining three sections of the PROM listing, that such clipping is performed regardless of whether the second quantization was in the normal range or in one of the under-range or over-range.

Having illustrated and described the principles of my invention with reference to a preferred embodiment and two variations thereof, it should be apparent to those skilled in the art that the invention may be modified in arrangement and detail without departing from such principles. I claim all such variations coming within the scope and spirit of the following claims.

I claim:

1. A method for diagnosing nonlinearities in the internal operation of a dual-flash analog-to-digital converter including a first quantizer means for quantizing an analog input signal in accordance with a plurality of coarse quantizing levels to produce a more-significant-digits digital output signal, numerically indicating a truncated portion of the analog input signal, and a remainder analog signal corresponding to the undigitized portion of the analog input signal, and a second quantizer means for quantizing the remainder analog signal in accordance with a plurality of fine quantizing levels to produce a less-significant-digits digital output signal numerically indicating the value of the remainder analog signal; the method comprising:

applying an analog input test signal to the converter;
repetitively actuating the converter to convert said test signal to produce said digital output signals and remainder analog signal;
comparing the remainder analog signal to a predetermined threshold to produce an error signal whenever the remainder analog signal exceeds said threshold; and
averaging the error signals from a plurality of successive actuations of the converter to produce an average error signal.

2. A method according to claim 1 in which the repetitive actuation step comprises periodically actuating the converter at a predetermined frequency and the averaging step comprises time-averaging the error signals over a time interval substantially greater than the time between actuations of the converter to produce a time-average error signal defining said average error signal.

3. A method according to claim 1, including comparing the average error signal to a predetermined error signal threshold to produce an error indicator signal whenever the average error signal exceeds said error signal threshold.

4. A method according to claim 1, in which the comparing step further includes comparing the numerical value of said more-significant digits to a predetermined level threshold to produce a level signal whenever said value exceeds said level threshold, and the averaging step includes averaging the level signals from a plurality of successive actuations of the converter to produce, from the level signal, an average level signal.

5. A method according to claim 4, including comparing the average level signal to a predetermined level signal threshold to produce a level indicator signal whenever the average level signal exceeds said level signal threshold.

6. A method according to claim 1, in which the comparing step includes comparing the remainder analog signal to two different thresholds.

7. A method according to claim 1, in which the comparing step includes comparing the remainder analog signal to two different thresholds set one above and one below a predetermined quantizing range of the second quantizer means to produce a first error signal whenever the analog remainder signal is above said range and a second error signal whenever the analog remainder signal is below said range.

8. A method according to claim 7 including logically ORing said first and second error signals together to produce said error signal whenever the remainder signal is outside said quantizing range.

9. A method for diagnosing nonlinearities in the internal operation of a dual-flash analog-to-digital converter including a first quantizer means for quantizing an analog input signal in accordance with a plurality of coarse quantizing levels to produce a first digital signal, containing M more-significant-digits numerically indicating a truncated portion of the analog input signal, and a remainder analog signal corresponding to the undigitized portion of the analog input signal; a second quantizer means for quantizing the remainder analog signal in accordance with a plurality of fine quantizing levels to produce a second digital signal containing N less-significant-digits numerically indicating the value of the remainder analog signal; and including at least one redundant digit for indicating a quantization error, in said first and second digital signals; and a digital error correcting means for detecting and correctig said quantization error to produce a corrected digital output signal containing fewer than M+N−1 digits numerically indicating the value of said analog input signal; the method comprising:
- applying an analog input signal to the converter;
- repetitively actuating the converter to produce said digital output signals and remainder analog singal;
- outputting an M+Nth digit defining an error signal whenever the digital error correcting means corrects a quantization error;
- time-averaging the error signals of successive repetitions of the foregoing steps to produce a time-averaged error signal; and
- comparing the time-averaged error signal to a predetermined error threshold to produce an error indicator signal whenever the time-averaged error signal exceeds said error threshold.

10. A method according to claim 9 including comparing said first digital signal to a predetermined level threshold to produce a high-level digital signal whenever the first digital signal exceeds said level threshold.

11. A method for applying level clipping to a dual-flash analog-to-digital converter including a first quantizer means for quantizing an analog input signal in accordance with a plurality of coarse quantizing levels to produce a first digital signal, containing M more-significant digits numerically indicating a truncated portion of the analog input signal, and a remainder analog signal corresponding to the undigitized portion of the analog input signal; a second quantizer means for quantizing the remainder analog signal in accordance with a plurality of fine quantizing levels to produce a second digital signal containing N less-significant digits numerically indicating the value of the remainder analog signal; and including at least one redundant digit for indicating a quantization error, in said first and second digital signals; and a digital error correcting means for detecting and correcting said quantization error to produce a corrected digital output signal containing fewer than M+N digits numerically indicating the value of said analog input signal; the method comprising:
- comparing said first digital signal to a clipping threshold; and
- modifying said corrected digital output signal to a predetermined value whenever the first digital signal is outside a range defined by said threshold.

12. A dual-flash analog-to-digital converter comprising:
- first quantizer means for quantizing an analog input signal in accordance with a plurality of coarse quantizing levels to produce a first digital signal, containing M more-significant digits and a remainder analog signal corresponding to the undigitized portion of the analog input signal;
- a second quantizer means for quantizing the remainder analog signal in accordance with a plurality of fine quantizing levels having a total value exceeding the value of a least significant one of said more significant bits, a mid-portion of said fine quantizing levels defining a normal quantizing range and end portions thereof defining under-range and over-range quantizing ranges, to produce a second digital signal containing N less-significant digits indicating numerically the fine quantization level of the remainder analog signal;
- time generator means for periodically actuating said first and second quantizer means; and
- digital error correction means having as inputs said M more-significant digits and at least two most-significant of said M less-significant digits for generating therefrom a corrected digital output signal containing fewer than M+N data digits numerically indicating the value of the analog input signal and containing an error digit indicating whether the remainder analog signal was quantized in one of said over-range and under-range quantizing ranges.

13. An analog-to-digital converter according to claim 12, including time-averaging means for averaging said error digit over a time interval encompassing a plurality of successive operations of said converter to produce a time-averaged error signal.

14. An analog-to-digital converter according to claim 13, including means for comparing the time averaged error signal to a predetermined threshold to produce an error indicator signal whenever the value of the time averaged error signal exceeds said threshold; and means responsive to said indicator signal for displaying said indicator signal.

15. An analog-to-digital converter according to claim 12 in which the digital error corrector means includes means for monitoring a most significant one of said more significant digits and including in said corrected digital output signal a level digit to indicate whether the analog input signal is at least as great as the quantization level of said selected digit.

16. An analog-to-digital converter according to claim 11, including time-averaging means for averaging said level digit over a time interval encompassing a plurality of successive operations of said converter to produce a time-averaged level signal.

17. An analog-to-digital converter according to claim 16, including means for comparing the time-averaged level signal to a predetermined threshold to produce a level indicator signal whenever the value of the time-averaged level signal exceeds said threshold; and means responsive to said indicator signal for visibly displaying said indicator signal.

18. An analog-to-digital converter according to claim 12, including a switchable clip enable signaling means for selectably inputting a clip enable signal to the digital error corrector means, the error corrector means including means responsive to the clip enable signal for comparing the value of the first digital signal to a predetermined digital value defining a limit of an output signal range and for modifying said corrected digital output signal whenever the first digital signal is outside said output range so as to substitute therefor a predetermined digital output signal.

19. A dual-flash analog-to-digital converter comprising:
- first quantizer means for quantizing an analog input signal in accordance with a plurality of coarse quantizing levels to produce a first digital signal, containing M more-significant digits and a remainder analog signal corresponding to the undigitized portion of the analog input signal;
- a second quantizer means for quantizing the remainder analog signal in accordance with a plurality of fine quantizing levels having a total value exceeding the value of a least significant one of said more significant bits, a mid-portion of said fine quantizing levels defining a normal quantizing range and end portions thereof of defining under-range and over-range quantizing ranges, to produce a second digital signal containing N less-significant digits indicating numerically the fine quantization level of the remainder analog signal;
- time generator means for periodically actuating said first and second quantizer means; and
- digital error correction means having as inputs said M more-significant digits and at least two most-significant of said less significant digits for generating from said inputs a corrected digital output signal;
- a switchable clip enable signaling means for selectably inputting a clip enable signal to the digital error corrector means;
- the error corrector means including means responsive to the clip enable signal for comparing the value of said M more-significant digits to a predetermined digital value defining a limit of an output signal range and for modifying said corrected digital output signal whenever the value of said more-significant digits is outside said output range so as to substitute therefor a predetermined digital output signal.

* * * * *